US008038497B2

(12) United States Patent
Le Toquin (10) Patent No.: US 8,038,497 B2
(45) Date of Patent: Oct. 18, 2011

(54) METHODS OF FABRICATING LIGHT EMITTING DEVICES BY SELECTIVE DEPOSITION OF LIGHT CONVERSION MATERIALS BASED ON MEASURED EMISSION CHARACTERISTICS

(75) Inventor: Ronan P. Le Toquin, Ventura, CA (US)

(73) Assignee: Cree, Inc., Durham, NC (US)

( * ) Notice: Subject to any disclaimer, the term of this patent is extended or adjusted under 35 U.S.C. 154(b) by 99 days.

(21) Appl. No.: 12/428,149

(22) Filed: Apr. 22, 2009

(65) Prior Publication Data

US 2009/0286335 A1 Nov. 19, 2009

Related U.S. Application Data

(60) Provisional application No. 61/050,414, filed on May 5, 2008.

(51) Int. Cl.
*H01J 9/00* (2006.01)
*H01L 21/66* (2006.01)

(52) U.S. Cl. .................................. 445/25; 438/7; 438/14

(58) Field of Classification Search .............. 445/24–25, 445/3; 438/14, 16, 22
See application file for complete search history.

(56) References Cited

U.S. PATENT DOCUMENTS

| 6,395,564 B1 * | 5/2002 | Huang ............................... 438/7 |
| 6,858,456 B2 * | 2/2005 | Noguchi et al. ................ 438/26 |
| 7,344,952 B2 * | 3/2008 | Chandra ............... 257/E21.352 |
| 2005/0274967 A1 * | 12/2005 | Martin et al. .................... 257/98 |
| 2006/0057753 A1 * | 3/2006 | Schardt et al. .................. 438/22 |
| 2007/0075629 A1 | 4/2007 | LeToquin et al. |
| 2008/0283864 A1 | 11/2008 | LeToquin et al. |
| 2009/0095966 A1 * | 4/2009 | Keller et al. .................... 257/98 |
| 2010/0065864 A1 * | 3/2010 | Kessels et al. ................. 257/89 |
| 2010/0140633 A1 * | 6/2010 | Emerson ......................... 438/27 |

FOREIGN PATENT DOCUMENTS

| EP | 1 696 016 A1 | 8/2006 |
| JP | 09214675 A * | 8/1997 |
| JP | 2004253745 A * | 9/2004 |

* cited by examiner

*Primary Examiner* — Mariceli Santiago
(74) *Attorney, Agent, or Firm* — Myers Bigel Sibley & Sajovec, P.A.

(57) ABSTRACT

A method of fabricating a light emitting device (LED) includes measuring emission characteristics for a plurality of LED chips configured to emit light of a first color. The plurality of LED chips are sorted based on the measured emission characteristics to provide a plurality of groups respectively including ones of the plurality of LED chips having similar measured emission characteristics. A respective light conversion material is selected for each of the plurality of groups based on the measured emission characteristics of the ones of the plurality of LED chips included therein and a desired color point. The selected light conversion material is configured to absorb at least some of the light of the first color and responsively emit light of a second color. For each of the plurality of groups, the respective selected light conversion material is deposited on the ones of the LED chips included therein to provide a plurality of packaged LEDs including the plurality of LED chips and respectively configured to emit light having the desired color point. Related apparatus is also discussed.

21 Claims, 6 Drawing Sheets

METHODS OF FABRICATING LIGHT EMITTING DEVICES BY SELECTIVE DEPOSITION OF LIGHT CONVERSION MATERIALS BASED ON MEASURED EMISSION CHARACTERISTICS

CROSS-REFERENCE TO RELATED PATENT APPLICATIONS

This application claims priority from U.S. Provisional Patent Application Ser. No. 61/050,414 filed May 5, 2008, the disclosure of which is hereby incorporated by reference herein in its entirety.

FIELD OF THE INVENTION

The present invention relates to semiconductor light emitting devices, and more particularly, to methods of fabricating semiconductor light emitting devices.

BACKGROUND OF THE INVENTION

Light emitting diodes (LEDs) are semiconductor devices that convert electric energy to light. Inorganic LEDs typically include an active layer of semiconductor material and a P-N junction formed at an interface between two oppositely doped layers. When a bias is applied across the P-N junction, holes and/or electrons are injected by the P-N junction into the active layer. Recombination of holes and electrons in the active layer generates light that can be emitted from the LED. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it may be highly desirable to generate wide bandwidth, polychromatic light, such as white light, using a solid state light source. One way to produce white light from conventional LEDs is to surround a single-color LED chip or die with a light conversion material, such as a phosphor. In general, phosphors absorb light having shorter wavelengths and re-emit light having longer wavelengths. At least some of the light emitted by the LED chip at a first wavelength (primary light) may be absorbed by the phosphor, which may responsively emit light at a second wavelength (secondary light). The primary light emitted by the LED chip and the secondary light emitted by the phosphor particles may combine to produce light having a plurality of wavelengths, which may be perceived as having a different color than either the primary light or the secondary light.

For example, light from a blue-emitting LED chip has been converted to white light by surrounding the LED with a yellow phosphor, polymer or dye, such as cerium-doped yttrium aluminum garnet (YAG:Ce). The phosphor material absorbs and "downconverts" some of the blue light generated by the LED chip. That is, the phosphor material generates light, such as yellow light, in response to absorbing the blue light. Thus, some of the blue light generated by the LED chip appears to be converted to yellow light. Some of the blue light from the LED chip passes through the phosphor without being changed, however. Accordingly, the overall LED/phosphor structure or package emits both blue and yellow light, which combine to provide light that is perceived as white light.

Figure 1:
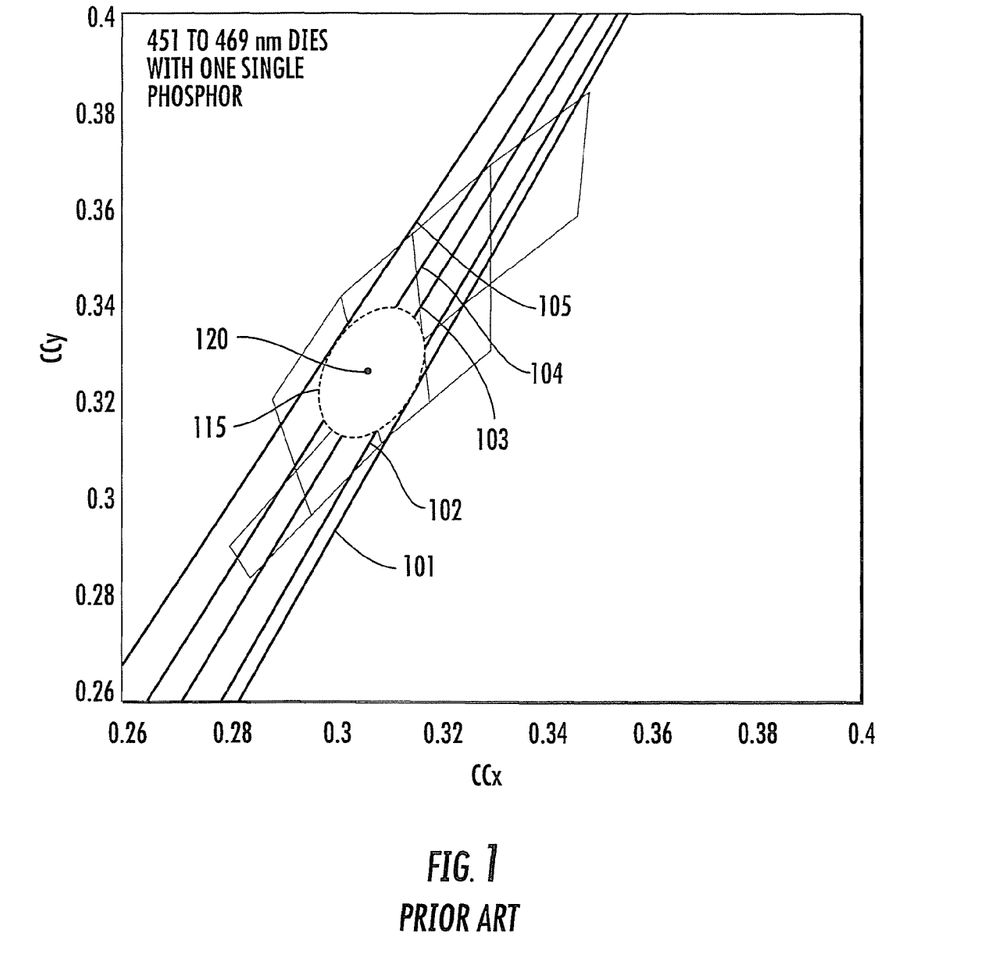
FIG. 1 is a region of a chromaticity diagram illustrating emission characteristics of packaged LEDs fabricated according to conventional methods.

FIG. 1 is a region of a 1931 International Commission on Illumination (CIE) chromaticity diagram illustrating the color point distribution of packaged LEDs configured to emit white light fabricated according to conventional methods. Referring now to FIG. 1, a plurality of blue LED chips are configured to emit light over a wavelength range of 451 to 469 nanometers (nm). A yellow-emitting phosphor is deposited on all of the blue LED chips according to conventional methods such that the overall LED/phosphor package emits both blue and yellow light, which combine to provide light that is perceived as white light. Lines 101, 102, 103, 104, and 105 respectively represent the color points of light that may be produced by the blue LED chips having emission wavelengths of 451 nm, 455 nm, 461 nm, 465 nm, and 469 nm in combination with the yellow-emitting phosphor. As shown in FIG. 1, the lines 102, 103, and 104 fall inside a 7-step MacAdam ellipse 115 around a targeted color point 120 at the center of the ellipse 115. The MacAdam ellipse 115 is an elliptical region of chromaticity coordinates that is defined based on a center, a tilt angle relative to a horizontal axis, and a level of variance. The color points contained within the MacAdam ellipse 115 are indistinguishable to the human eye from the targeted color point 120 at the center of the ellipse 115. However, not all of the packaged LEDs emit white light having a color point within the ellipse 115. In particular, the LED chips emitting light at wavelengths of 451 nm and 469 nm, respectively represented by lines 101 and 105, fall outside of the 7-step MacAdam ellipse 115.

In some instances, it may be advantageous for packaged LEDs targeting a specific color point to emit white light within a 4-step MacAdam ellipse around the targeted color point. A tighter distribution may result in a higher yield, so targeting the color point within a 4 step MacAdam ellipse may tighten the distribution and thus improve yields. However, as illustrated in FIG. 1, the electrical and/or optical parameters of individual packaged LEDs that are fabricated according to conventional methods may vary considerably, for example, due to routine process variations. Accordingly, improved fabrication methods may be desired.

SUMMARY OF THE INVENTION

According to some embodiments of the present invention, a method of fabricating a light emitting device (LED) includes measuring emission characteristics for a plurality of LED chips configured to emit light of a first color. The plurality of LED chips are sorted based on the measured emission characteristics to provide a plurality of groups respectively including ones of the plurality of LED chips having similar measured emission characteristics. A respective light conversion material configured to absorb at least some of the light of the first color and responsively emit light of a second color is selected for each of the plurality of groups based on the measured emission characteristics of the ones of the plurality of LED chips included therein and a desired color point. For each of the plurality of groups, the respective selected light conversion material is deposited on the ones of the LED chips included therein to provide a plurality of packaged LEDs. The plurality of packaged LED include the plurality of LED chips, and are respectively configured to emit light having the desired color point.

In some embodiments, the emission characteristics may be measured by measuring a radiant flux, color point and/or a wavelength of the light emitted by each of the plurality of LED chips.

In other embodiments, the respective light conversion material for each of the plurality of groups may be selected based on an average of the measured wavelengths for the ones of the LED chips included therein to have a color point such that, when deposited on the LED chips, the combination of the light emitted from the ones of the LED chips and the respective light conversion material provides the appearance of light having the desired color point. For example, for each of the plurality of groups, color coordinates may be determined on a CIE 1931 chromaticity diagram based on a line defined by the average of the measured wavelengths for the ones of the LED chips included therein and the desired color point, and the respective light conversion material having the color point defined by determined color coordinates may be selected for each of the plurality of groups.

In some embodiments, a thickness of the respective selected light conversion material may be determined for each of the plurality of groups based on an average of the measured radiant fluxes for the ones of the LED chips included therein. For each of the plurality of groups, the respective light conversion material may be deposited to the respective determined thickness on the ones of the LED chips included therein such that the combination of the light emitted from the ones of the LED chips and the respective light conversion material provides the appearance of light having the desired color point. For example, for each of the plurality of groups, the respective light conversion material may include a phosphor and an encapsulant solution or simply a phosphor layer. The thickness of the respective selected light conversion material may be determined for each of the plurality of groups based on a phosphor concentration per volume of the encapsulant solution. In some embodiments, the respective light conversion material selected for each of the plurality of groups may be a same light conversion having different thicknesses for each of the plurality of groups.

In other embodiments, the respective light conversion material for each of the plurality of groups may be a same light conversion material having different doping concentrations and/or particle sizes for each of the plurality of groups.

In some embodiments, in each of the plurality of groups, the ones of the plurality of LED chips may be respectively configured to emit light of the first color having a wavelength within a range of about 5 nanometer (nm) or less of one another.

In other embodiments, in each of the plurality of groups, the ones of the plurality of LED chips are respectively configured to emit light of the first color having a radiant flux within a range of about 10-20 milliwatts (mW) or less of one another.

In some embodiments, the light having the desired color point may be light having a color point within a four-step MacAdam ellipse centered around the desired color point.

In other embodiments, the plurality of LED chips may be configured to emit light within a blue wavelength range, and the respective light conversion material selected for each of the plurality of groups may be a yellow-emitting phosphor.

In some embodiments, for each of the plurality of groups, the respective light conversion material may be a first light conversion material. A second light conversion material configured to absorb at least some of the light of the first and/or second colors and responsively emit light of a third color may be selected for at least some of the plurality of groups based on the measured emission characteristics of the ones of the plurality of LED chips included therein, the emission characteristics of the first light conversion material, and the desired color point. For the at least some of the plurality of groups, the respective second light conversion material may be deposited on the ones of the LED chips included therein to provide the plurality of packaged LEDs. The plurality of packaged LEDs may include the plurality of LED chips and may respectively be configured to emit light having the desired color point. For example, the plurality of LED chips may be configured to emit light within a blue wavelength range, the first light conversion material selected for each of the plurality of groups may be a yellow/green-emitting phosphor, and the second light conversion material selected for the at least some of the plurality of groups may be a orange/red-emitting phosphor.

In other embodiments, the plurality of LED chips may correspond to a same wafer.

According to other embodiments of the present invention, a method of fabricating a light emitting device (LED) includes measuring emission characteristics for a plurality of LED chips. The plurality of LED chips are sorted based on the measured emission characteristics to provide first and second groups respectively including ones of the plurality of LED chips having similar measured emission characteristics. For the first group, a first light conversion material is selected based on the measured emission characteristics of the ones of the plurality of LED chips included therein and a desired color point. The first light conversion material is configured to absorb light of at least one wavelength emitted by the ones of the plurality of LED chips of the first group and responsively emit light of a different wavelength. For the second group, a second light conversion material is selected based on the measured emission characteristics of the ones of the plurality of LED chips included therein and the desired color point. The second light conversion material is configured to absorb light of at least one wavelength emitted by the ones of the plurality of LED chips of the second group and responsively emit light of a different wavelength. The first light conversion material is deposited on the ones of the LED chips included in the first group to provide a first plurality of packaged LEDs configured to emit light at the desired color point, and the second light conversion material is deposited on the ones of the LED chips included in the second group to provide a second plurality of packaged LEDs configured to emit light at the desired color point.

According to further embodiments of the present invention, an apparatus for fabricating a light emitting device (LED) includes a sensor, a sorting mechanism, a reservoir, a light conversion material supply line, a controller, and a dispensing mechanism. The sensor is configured to measure emission characteristics for a plurality of LED chips configured to emit light of a first color. The sorting mechanism is configured to sort the plurality of LED chips based on the measured emission characteristics to provide a plurality of groups respectively including ones of the plurality of LED chips having similar measured emission characteristics. The reservoir contains a plurality of light conversion materials configured to absorb at least some of the light of the first color and responsively emit light of a second color. The light conversion material supply line is coupled to the reservoir. The controller is configured to select a respective one of the plurality of light conversion materials for each of the plurality of groups based on the measured emission characteristics of the ones of the plurality of LED chips included therein and a desired color point. The controller is further configured to provide a signal to the reservoir to supply the respective light conversion material selected for each of the plurality of groups to the supply line. The dispensing mechanism is coupled to the supply line, and is configured to deposit the respective light conversion material selected for each of the plurality of groups on the ones of the LED chips included therein to provide a plurality of packaged LEDs comprising the plurality of LED chips. The plurality of packaged LEDs are respectively configured to emit light having the desired color point.

In some embodiments, the apparatus may include pick and place tools, for example, where the phosphor or other light conversion material is preformed into sheets. In this case, the emission characteristics of the LED chips and the phosphor sheets can be measured separately before selection of the particular phosphor for each of the groups of LED chips.

DETAILED DESCRIPTION OF EMBODIMENTS OF THE INVENTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention is described below with reference to flowchart illustrations and/or block and/or flow diagrams of methods, devices, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block and/or flow diagram block or blocks.

These computer program instructions may also be stored in a computer-readable memory that can direct a computer or other programmable processor to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processor to cause a series of operational steps to be performed on the computer or other programmable processor to produce a computer implemented process such that the instructions which execute on the computer or other programmable processor provide steps for implementing the functions or acts specified in the flowchart and/or block diagram block or blocks. It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, the term "semiconductor light emitting device" and/or "LED" may include a light emitting diode, laser diode and/or other semiconductor device which includes one or more semiconductor layers, which may include silicon, silicon carbide, nitride compounds, and/or other semiconductor materials. A light emitting device may or may not include a substrate such as a sapphire, silicon, silicon carbide, gallium nitride and/or another microelectronic substrates. A light emitting device may include one or more contact layers which may include metal and/or other conductive layers. In some embodiments, ultraviolet, blue, cyan, green, amber, and/or red LEDs may be provided. The design and fabrication of semiconductor light emitting devices are well known to those having skill in the art and need not be described in detail herein.

As used herein, the term "light conversion material" may refer to any material that absorbs light at one wavelength and responsively emits light at a different wavelength, such as a phosphor, regardless of the delay between absorption and re-emission and regardless of the wavelengths involved. A fraction of the light may also be reemitted from the phosphor at essentially the same wavelength as the incident light, experiencing little or no conversion. Accordingly, the term "phosphor" may be used herein to refer to materials that are sometimes called fluorescent and/or phosphorescent. Light conversion materials according to embodiments of the present invention may be formed from any suitable phosphor material that is capable of converting light of one wavelength to another wavelength. For example, the phosphor material may be a cerium (Ce) doped single crystal, such as $Y_3Al_5O_{12}$ (YAG:Ce), in some embodiments. In other embodiments, other phosphors, such as Ce and/or europium (Eu) doped (Ca, Sr, Mg)AlSiN$_3$ (CASN or SCASN); Eu doped $Sr_{2-x}Ba_xSiO_4$ (BOSE); Eu2+ doped SiAlON, Eu2+ doped $Sr_3SiO_5$, Ce3+ doped $Tb_3Al_5O_{12}$ (TAG:Ce), Ce or Eu doped strontium thiogallate; or Eu2+ doped Sr2Si5N8, Eu2+ doped (Ca,Sr,Ba)Si2O2N2, Eu3+ doped (Bi,Y)VO4, $Y_2O_2S$, $La_2O_2S$, silicon garnet, $Y_2O_2S$ or $La_2O_2S$ may be used. In addition, in some embodiments, the phosphors described in European Patent Publication No. 1,696,016 and/or U.S. Patent Publication No. 2007/0075629 may also be used. The phosphor may also be doped at any suitable level. In some embodiments, Ce and/or Eu is doped into the single crystal phosphor such that the dopant concentration is in a range of about 0.1 to about 20%. Furthermore, the phosphor or other light conversion material may preformed into sheets, singulated into individual light conversion structures, and deposited on a light emitting surface using pick and place tools, as described in commonly assigned U.S. Patent Publication No. 2008/0283864, the disclosure of which is incorporated by reference herein.

Also, as described herein, light of a particular color may refer to light having a wavelength that falls within a wavelength range corresponding to the particular color within the spectrum of visible light. For example, blue light may have a wavelength of between about 440 nanometers (nm) and about 470 nm, green light may have a wavelength of between about 505 mm and about 555 nm, yellow light may have a wavelength of between about 565 nm and about 580 nm, and red light may have a wavelength of between about 610 nm and about 720 nm.

Some embodiments of the present invention may arise from a realization that, in conventional phosphor dispensing methods, hundreds or thousands of LED chips with different electrical and/or optical parameters may be grouped together for the phosphor coating mechanism. Thus, all of the LED chips may receive the same type and amount of phosphor coating, which may result in a large color point variance for packaged LEDs manufactured according to conventional methods. Accordingly, it may be advantageous to decrease the color point difference from one packaged LED to another by varying the amount, thickness, and/or color point of the light conversion material deposited on each LED chip in order to increase production yield to bin. In particular, each LED chip may emit light having a specific radiant flux (RF) and/or a specific average wavelength (WL), which may be measured for each LED chip. The amount, thickness, and/or the color point of a phosphor or other light conversion material to be deposited on each LED chip may be selected based on the measured emission characteristics for each chip and/or for a group of chips having similar measured emission characteristics. For example, for a blue LED chip, the amount and color point of a yellow phosphor to be deposited on the blue LED chip may be selected such that the combination of the light emitted by the blue LED chip and the yellow phosphor will provide an appearance of white light at a desired color point. Thus, in some embodiments of the present invention, the amount, thickness, and/or color point of a light conversion material may be varied for each LED chip to provide packaged LEDs that all provide light output at the same color point, despite the different emission characteristics of their component LED chips. As such, packaged LEDs targeting a specific color point/CCT may measure inside a 4-step MacAdam ellipse around the targeted color point.

Figure 2:
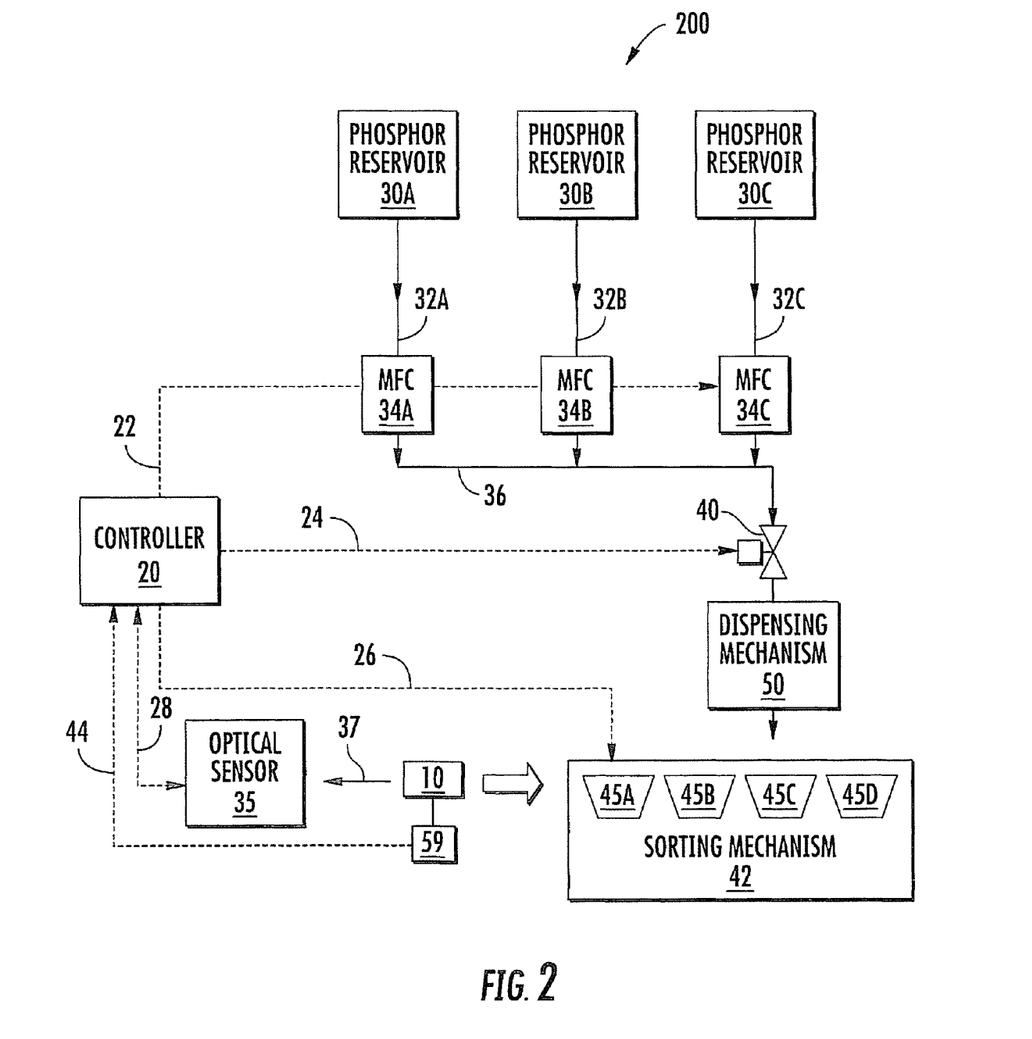
FIG. 2 is a block diagram illustrating an apparatus for fabricating packaged LEDs according to some embodiments of the present invention.

FIG. 2 is a schematic diagram illustrating an apparatus or system 200 for fabricating LEDs in accordance with some embodiments of the present invention. Referring now to FIG. 2, the system 200 is configured to selectively deposit light conversion materials on LED chips based on their measured emission characteristics such that all of the packaged LEDs produced thereby are configured to emit light at a desired color point. In particular, the system 200 includes a controller 20 coupled to an optical sensor 35 that is configured to measure emission characteristics of light 37 emitted by an LED structure 10. For example, the optical sensor 35 can measure the wavelength and/or the radiant flux of the light 37 emitted by the LED structure 10 when the LED structure 10 is energized by a probe 59. The measured emission characteristics can be provided to the controller 20 via a communication line 28, and can be used to control of the operations of the system 200, as described in greater detail below. The LED structure 10 can include an LED wafer, a mounted LED die or chip, and/or an unmounted (i.e. bare) LED chip. Accordingly, systems and methods according to embodiments of the invention can be used at various stages of a manufacturing process.

As shown in FIG. 2, the system 200 further includes a sorting mechanism 42 coupled to the controller 20 via control line 26, and a plurality of cartridges/reservoirs 30A to 30C respectively containing different light conversion materials. For example, the reservoirs 30A to 30C may each contain a liquid encapsulant material (e.g. epoxy, silicone, etc.) in which a concentration of phosphor particles is suspended. In some embodiments, each reservoir 30A to 30C may contain different phosphor particles configured to convert the light 37 emitted by the LED structure 10 into light of different colors. For instance, the reservoir 30A may contain a yellow-emitting phosphor, the reservoir 30B may contain a red-emitting phosphor, and the reservoir 30C may contain a green emitting phosphor. Alternatively, each reservoir 30A to 30C may contain different types of yellow-emitting phosphors (such as YAG, BOSE, and CASN), or may contain the same type of yellow-emitting phosphor but with different particle sizes and or optical characteristics. The reservoir 30C may also include scattering particles, such as Al2O3, TiO2, and/or ZrO2, in some embodiments. The reservoirs 30A to 30C are attached to a supply line 36 through respective input lines 32A to 32C. The flow of liquid through the input lines 32A to 32C can be controlled by electronically-controllable mass flow controllers 34A to 34C, respectively, which are coupled to the controller 20 via control line 22. The supply line 36 supplies one or more of the light conversion materials to a dispenser 50. The flow of the light conversion material(s) through the supply line 36 to the dispenser 50 can be controlled by an electronically controllable valve 40 coupled to the controller 20 by control line 24.

Based on the measured emission characteristics from the sensor 35, the sorting mechanism 42 can sort the LED structure 10 into one of a plurality of groups 45A to 45D containing LED chips having similar measured emission characteristics, such as similar emission wavelengths and/or similar radiant flux, responsive to a signal from the controller 20. For instance, where the LED structure 10 is an LED chip, the emission characteristics of the LED chip may be measured, and the LED chip may be sorted into one of the groups 45A to 45D that include other LED chips with similar emission characteristics. Alternatively, when the LED structure 10 is an LED wafer, the emission characteristics of representative areas and/or LED chips on the wafer may be measured, rather than testing every chip on the wafer. As such, after separating the chips from the wafer, the LED chips may be sorted into the groups 45A to 45D having similar emission characteristics based on the emission characteristics of the test locations on the LED structure 10. The LED structure 10 is therefore sorted into one of the groups 45A to 45D at the chip and/or wafer level, prior to phosphor deposition and/or completion of LED packaging.

The controller 20 may thereby select one or more of the light conversion materials from the reservoirs 30A to 30C for deposition on each of the groups of LED chips 45A to 45D based on the specific measured emission characteristics a particular group and a desired or targeted color point for the completed packaged LEDs. As such, the LED chips in each of the groups 45A to 45D may be coated with a different selected light conversion material and/or with a different thickness of the selected light conversion material depending on their particular emission characteristics, as discussed in greater detail below.

Still referring to FIG. 2, the controller 20 can control operations of the mass flow controllers 34A to 34C and the valve 40 via the electronic control lines 22 and 24 to provide a selected light conversion material from the corresponding one of the reservoirs 30A to 30C to the dispenser 50. The controller 20 can be a conventional programmable controller and/or can include an application specific integrated circuit (ASIC) configured to control operation of the respective elements of the system 100, or a general microprocessor or controller (e.g. computer). Accordingly, the controller 20 can precisely control the composition of the material that is supplied to the dispenser 50 through the supply line 36 by controlling the operations of the mass flow controllers (MFCs) 34A to 34C. The controller can further control the amount of the selected light conversion material that is supplied to the dispenser 50 (and thus, the thickness of the light conversion material to be deposited) by controlling the operation of the valve 40. The dispenser 50 may thereby deposit the light conversion material(s) selected for each of the groups 45A to 45D onto the LED chips of that group to provide packaged LEDs configured to emit light at a desired color point. The selected light conversion materials may be deposited by volumetric dispense methods, stencil printing, droplet deposition, and/or other well-known deposition methods. For example, the selected light conversion material may be deposited by forming a bead of the light conversion material on an end of the dispenser 50 and contacting the formed bead with an LED chip and/or a reflective cavity in which the LED chip is mounted to dispense the bead from the dispenser 50.

It will be appreciated that while FIG. 2 illustrates three phosphor reservoirs 30A to 30C, additional or fewer reservoirs can be provided and attached to the supply line through respective MFCs and/or supply valves that can be electronically controlled by the controller 20. For example, separate phosphor reservoirs can be provided for red phosphors, green phosphors, yellow phosphors, blue phosphors, etc., to be deposited alone and/or in combination depending on the desired color point for the packaged LEDs. It will be further appreciated that a system 200 as illustrated in FIG. 2 may be split into several parts, so that, for example, separate supply lines 36 are provided and/or separate dispensers 50 are provided for each group of LED chips 45A to 45D. Additionally, a system could have one supply line 36 and dispenser 50 dedicated to depositing each one of the light conversion materials. Accordingly, many different combinations of reservoirs, supply lines and dispensers are contemplated according to various embodiments.

Also, although FIG. 2 illustrates deposition of the light conversion materials via a dispenser 50, it is to be understood that other deposition methods, such as electrophoretic deposition, may be employed in accordance with some embodiments of the present invention. For example, each group of LED chips having similar measured emission characteristics may be immersed in an electrolyte-based solution including the selected light conversion material(s) for that group of LED chips, and the LED chips may be coated with the selected conversion material(s) responsive to a current applied to the solution. Alternatively, the phosphor or other light conversion material may be preformed into sheets, and the system 200 may include tools that may be used to singulate and deposit the light conversion material onto each group of LED chips having similar measured emission characteristics. The emission characteristics of the LED chips and the phosphor sheets can be measured separately before selection of the particular phosphor for each of the groups of LED chips.

Figure 3:
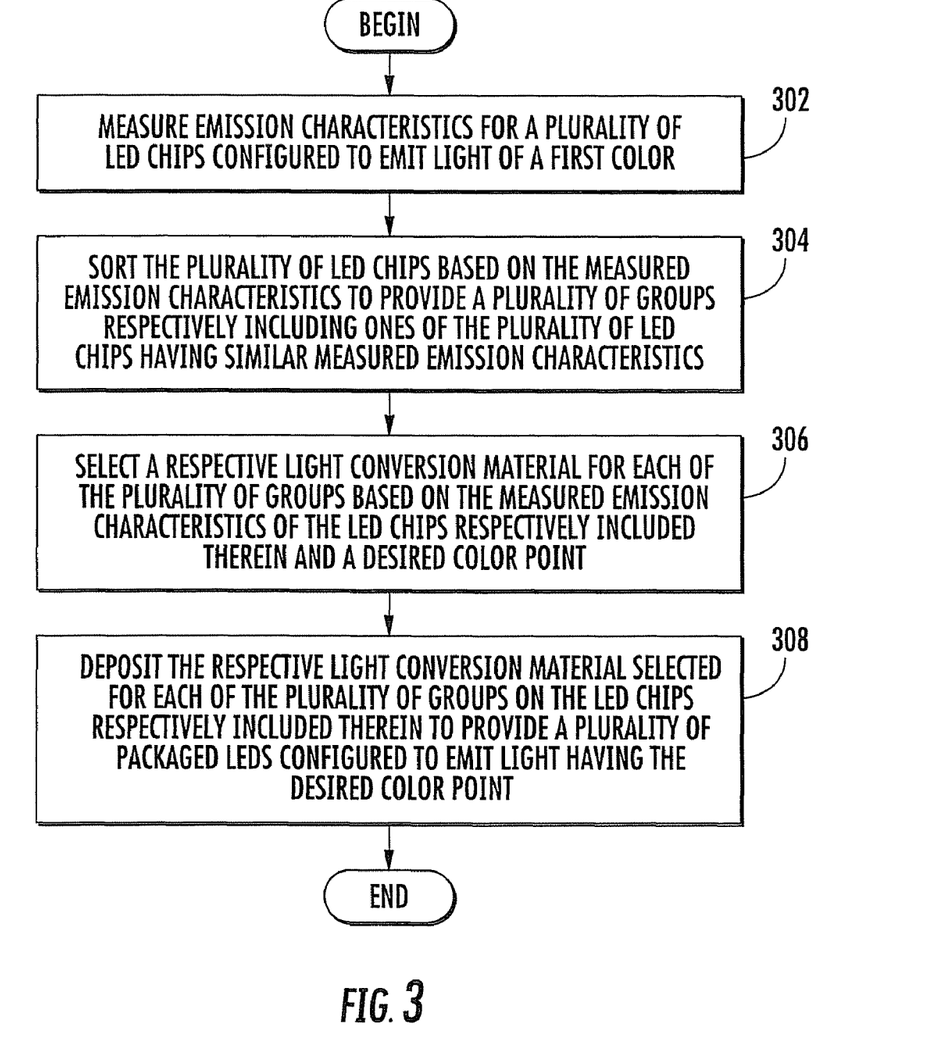
FIG. 3 is a flowchart illustrating example operations for fabricating packaged LEDs according to some embodiments of the present invention.

FIG. 3 is a flowchart illustrating example operations for fabricating light emitting devices (LEDs) in accordance with some embodiments of the present invention. Referring now to FIG. 3, emission characteristics are measured for a plurality of LED chips at block 302. For example, each LED chip may be energized using a probe, and the light output by the LED chip may be measured using an optical sensor. The measured emission characteristics may include the wavelength (WL) and/or radiant flux (RF) of the light emitted by each of the LED chips. The LED chips are configured to emit light of the same color. For example, the LED chips may be configured to emit blue light within a wavelength range of about 440 nm to about 470 nm. In some embodiments, the LED chips may be provided from the same LED wafer. For example, an LED wafer may include a plurality of epitaxial layers that define a light emitting diode structure, and may be divided into a plurality of discrete chip regions, for example, by dicing using a dicing saw. Such techniques are well known to those of ordinary skill in the art and will not be discussed further herein.

The LED chips are sorted into a plurality of groups based on the measured emission characteristics for each of the LED chips at block 304, such that each of the groups include LED chips having similar measured emission characteristics. For example, the LED chips may be sorted into groups having similar peak emission wavelengths. In particular, the LED chips in each group may emit light having a peak wavelength within a range of about 5 nm or less of one another. The LED chips may also be sorted into groups having similar radiant flux. For example, the LED chips in each group may emit light having a radiant flux in a range of about 10-20 milliwatts (mW) of one another, which may represent about 2% to about 5% of the overall light output of the products in which the LED chips may be incorporated. It will be understood that this range may be lower for other die sizes. When the LED chips are provided from a same LED wafer, it may be possible to measure the emission characteristics of representative test areas/chips on the wafer prior to dicing and/or otherwise separating the chips from the wafer. As such, the LED chips may be sorted into groups based on the light output from the test locations. The sorting of block 304 is thus performed at the chip and/or wafer level, prior to completion of the packaged LEDs.

Still referring to FIG. 3, a respective light conversion material is selected for each of the groups of LED chips at block 306. The light conversion material is selected for each group based on the measured emission characteristics of the LED chips included in the group and a desired or targeted color point. The light conversion material is configured to absorb at least some of the light emitted by the LED chips and responsively emit light of a different color. In some embodiments, the selected light conversion material may be a phosphor and/or a solution in which a concentration of phosphor particles is suspended. Accordingly, for each group of LED chips, a light conversion material is respectively selected such that the light output therefrom, in combination with the light output from the LED chips in that particular group, will provide an appearance of light having a desired color point.

A light conversion material may be selected for each group based on an average of the measured emission wavelengths for the LED chips included in each group. For example, to provide white light from blue-emitting LED chips sorted into two groups at block 304 based on their respective emission wavelengths measured at block 302, a first yellow-emitting phosphor, such as Ce-doped $Y_3Al_5O_{12}$ (YAG:Ce) may be selected for the first group of LED chips based on the average emission wavelength of the LED chips of the first group. Likewise, a second yellow-emitting phosphor, such as Eu-doped $Sr_{2-x}Ba_xSiO_4$ (BOSE), may be selected for the second group of LED chips based on the average emission wavelength of the LED chips of the second group. Alternatively, a same light conversion material with different doping profiles may be selected for each of the groups of LED chips. Further description of the selection of the light conversion material for each of the groups of LED chips is provided below with reference to FIG. 4.

Also, the thickness of the light conversion material to be deposited on the LED chips of each group may be selected based on an average of the measured radiant flux for the LED chips of each group. For instance, to provide white light from blue-emitting LED chips sorted at block 304 into two groups based on their respective radiant flux and color point measured at block 302, Ce-doped $Y_3Al_5O_{12}$ (YAG:Ce) may be selected for both groups of LED chips, but with different thicknesses for each group based on the average radiant flux of the LED chips of each group. Where the light conversion material includes phosphor particles suspended in a silicone solution, the thickness of the selected light conversion material for each group may also be based on a phosphor concentration per volume of the silicone solution. Further description of the selection of the thickness of the light conversion material for each of the groups of LED chips is provided below with reference to FIG. 5.

In some embodiments, multiple light conversion materials may be selected for one or more of the groups of LEDs to provide the appearance of light having the desired color point. For example, for a group of blue-emitting LED chips, a first light conversion material, such as a yellow-emitting phosphor configured to convert the blue light emitted by the LED chips into light in a yellow wavelength range, may be selected based on the measured emission characteristics of the blue-emitting LED chips, as discussed above. In addition, a second light conversion material may be selected based on the measured emission characteristics of the blue-emitting LED chips and/or the emission characteristics of the first light conversion material. For instance, a red-emitting phosphor configured to convert the blue light emitted by the LED chips of the particular group and/or the yellow light emitted by the first light conversion material into red light may be selected. Accordingly, the first and second light conversion materials may be selected such that the yellow and red light emitted therefrom, in combination with the blue light emitted by the LED chips in the particular group, provides the appearance of white light having a desired color point. Such first and second light conversion materials may also be sequentially deposited. For example, the red-emitting phosphor may be deposited first, and then the color point of the blue-emitting LED chips and the red-emitting phosphor may be measured. Based on the measured emission characteristics of the combination of the blue-emitting LED chips and the red-emitting phosphor, the phosphor thickness and/or concentration of a yellow- or green-emitting phosphor may be selected in order to more accurately target the final color point.

At block 308, the respective light conversion material(s) selected for each of the groups is deposited on the LED chips of each group to provide a plurality of packaged LEDs. The selected light conversion material(s) for each group may be deposited by a number of known methods. For example, where the respective light conversion material(s) selected at block 306 include phosphor particles suspended in a silicone solution, the respective light conversion materials may be deposited via volumetric dispense methods, stencil printing, electrophoretic deposition, and/or droplet deposition, as discussed above with reference to FIG. 2. Each packaged LED fabricated according to some embodiments of the present invention may therefore include an LED chip and a light conversion material of a different type and/or thickness that is specifically selected based on the measured emission characteristics of the LED chips in each group. In other words, the type and/or amount of light conversion material deposited on each LED chip is tailored based on the particular emission characteristics of each group of LED chips, in contrast to conventional fabrication methods where all LED chips may be coated with the same type and amount of phosphor. Thus, packaged LEDs according to some embodiments of the present invention may be configured to emit light having a substantially similar color point, despite the different electrical and/or optical characteristics of their component LED chips.

Although discussed above primarily with reference to forming packaged LEDs configured to emit white light, it is to be understood that the operations described above with reference to the flowchart of FIG. 3 may be used to fabricate packaged LEDs configured to emit light having any desired color. For example, a red-emitting phosphor may be selected at block 306 that is configured to absorb most and/or all of the light emitted by a particular group of blue LED chips to provide an appearance of red light having a desired color point. Likewise, a green emitting phosphor may be selected at block 306 that is configured to absorb most and/or all of the light emitted by a particular group of blue LED chips to provide green light having a desired color point. Also, although discussed above primarily with reference to sorting blue LED chips into different groups based on their measured emission characteristics, the emission characteristics of LED chips configured to emit other colors of light may be measured and sorted, and respective light conversion materials may be selected based on the measured emission characteristics to provide light of other colors at a desired color point.

Figure 4:
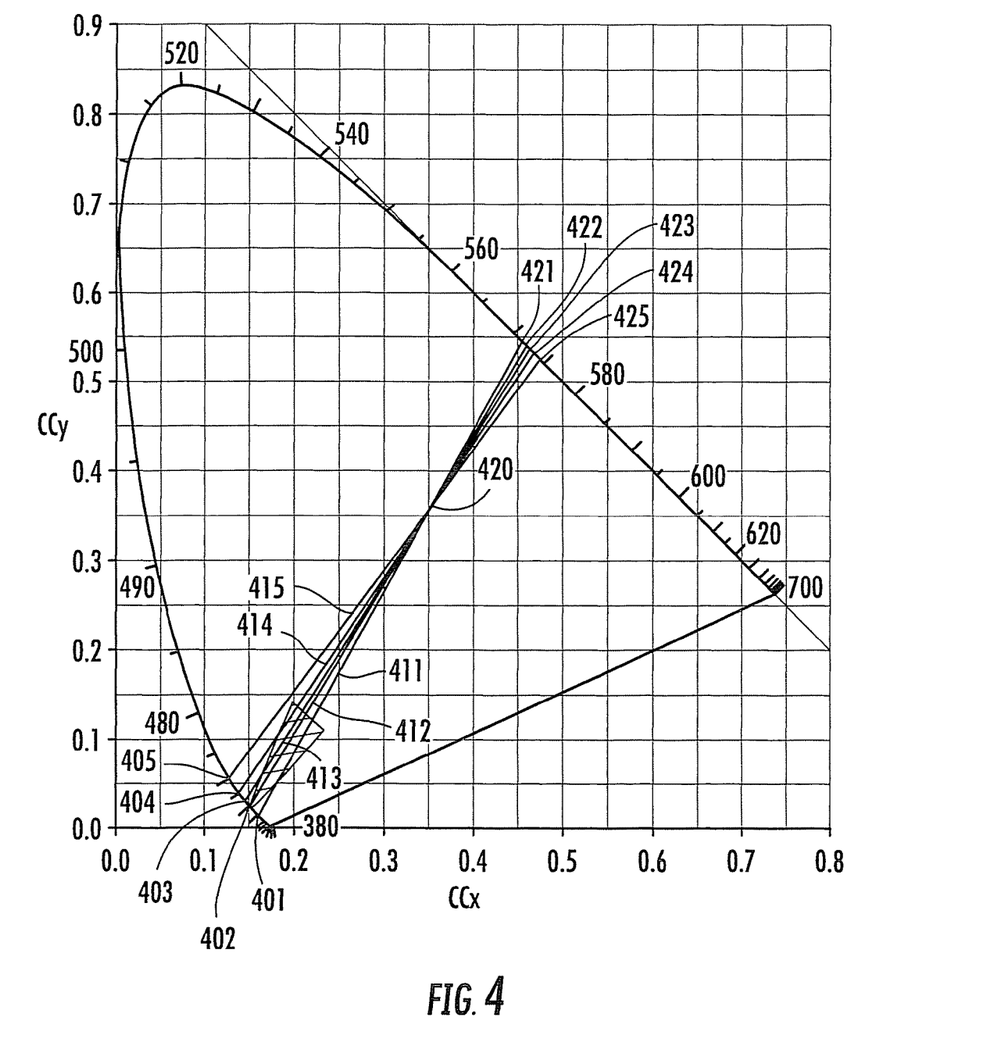
FIG. 4 is a chromaticity diagram illustrating light conversion material selection methods for fabricating packaged LEDs according to some embodiments of the present invention.

FIG. 4 is a 1931 CIE chromaticity diagram illustrating the selection of light conversion materials based on the measured wavelength of LED chips according to some embodiments of the present invention. In FIG. 4, the gamut of all visible chromaticities is illustrated as a horseshoe-shaped figure. More particularly, the curved edge 400 of the gamut is called the spectral locus, and corresponds to monochromatic light, with wavelengths listed in nanometers (nm). The straight edge 410 on the lower part of the gamut is called the purple line. These colors, although they are on the border of the gamut, have no counterpart in monochromatic light. Less saturated colors appear in the interior of the figure, with white at the center. All colors that can be formed by mixing any two colors will lie on a straight line connecting two points that represent the two colors on the chromaticity diagram. Likewise, all colors that can be formed by mixing three colors can be found inside the triangle formed by the corresponding points on the chromaticity diagram (and so on for multiple sources).

For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the color or hue of the white light source. Packaged LEDs fabricated according to some embodiments of the present invention may be configured to emit white light having a correlated color temperature (CCT) of about 2500 Kelvin (K) to about 10,000 K.

As shown in FIG. 4, the blue-emitting LED chips have been sorted into five groups having average measured emission wavelengths of 451 nm, 455 nm, 461 nm, 465 nm, and 469 nm, respectively. Color points 401-405 on the chromaticity diagram respectively represent the average emission wavelengths of each group. More particularly, color point 401 represents the group of LED chips having an average emission wavelength of about 451 nm; color point 402 represents the group of LED chips having an average emission wavelength of about 455 nm; color point 403 represents the group of LED chips having an average emission wavelength of about 461 nm; color point 404 represents the group of LED chips having an average emission wavelength of about 465 nm; and color point 405 represents the group of LED chips having an average emission wavelength of about 469 nm.

Respective light conversion materials are selected for each of the LED chip groups represented by the color points 401-405 to provide an appearance of light having a desired color point 420 based on the average emission wavelengths for each of the groups. More particularly, color coordinates (CCx, CCy) are determined for each of the groups based on the lines 411-415 defined by the color points 401-405 representing each group and the desired color point 420 on the chromaticity diagram. The color points 421-425 corresponding to the determined color coordinates are shown in FIG. 4. As such, for each group represented by the color points 401-405, respective light conversion materials having the determined color points 421-425 are selected. The lines 411-415 define all colors that can be formed by mixing respective ones of the colors represented by the color points 401-405 and 421-425. The amount or thickness of the respective light conversion material can be selected to provide light output at the desired color point 420 along the lines 411-415, as further discussed below.

Figure 5:
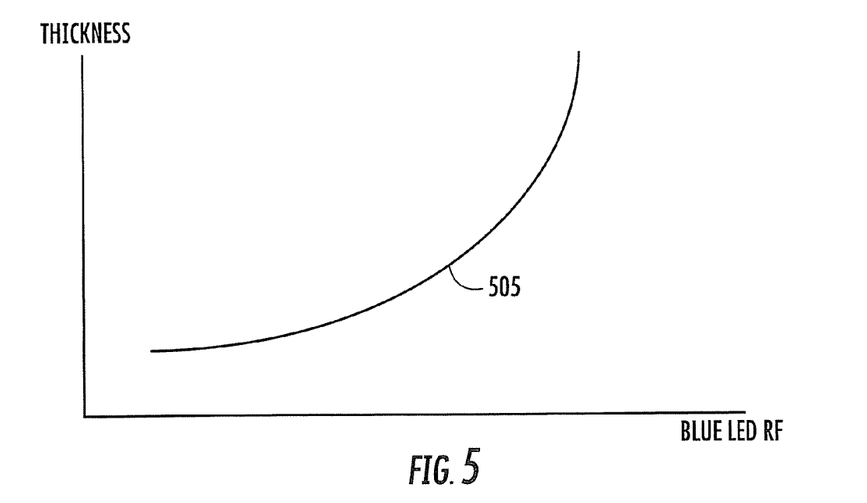
FIG. 5 is a graph illustrating the relationship between blue LED radiant flux and light conversion material thickness for fabricating packaged LEDs according to some embodiments of the present invention.
Figure 6A:
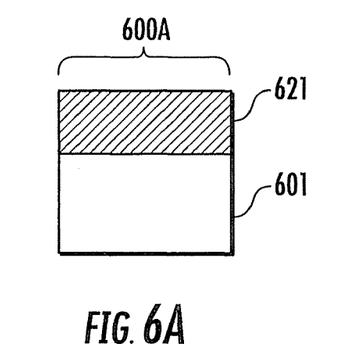
FIGS. 6A-6E illustrate example packaged LED structures fabricated according to some embodiments of the present invention.
Figure 6B:
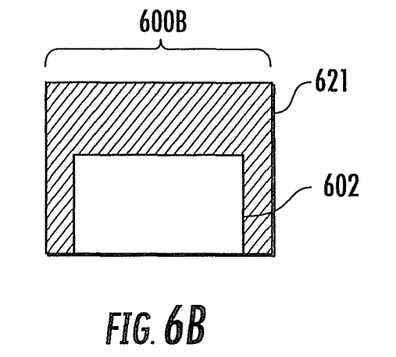
Figure 6C:
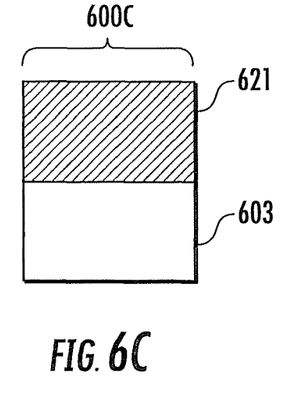
Figure 6D:
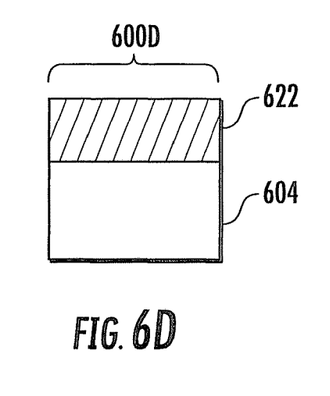
Figure 6E:
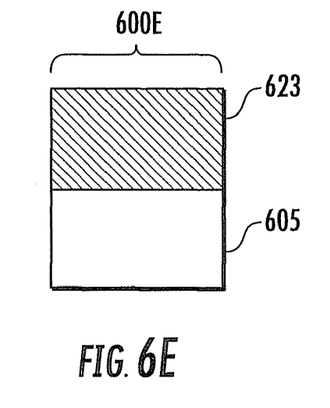

FIG. 5 is a graph illustrating the selection of a light conversion material thickness based on the measured radiant flux of LED chips according to some embodiments of the present invention. As shown in FIG. 5, a curve 505 relating an average radiant flux RF (in milliwatts) of a group of blue LED chips and thickness (in Angstroms) of a selected light conversion material is plotted based on the characteristics of the selected light conversion material. For example, where the selected light conversion material includes phosphor particles dispersed in a silicone solution, the curve 505 is based on the phosphor concentration per volume of the silicone solution. The selected thickness and the phosphor concentration may be highly correlated. More particularly, the selected thickness of the light conversion material may be a function of phosphor concentration, blue LED radiant flux, blue LED wavelength, and dispensed volume. As noted above, the LED chips in each of the groups may have a radiant flux within about 10-20 mW of one another. Accordingly, using the average of the radiant flux values measured for a group of LED chips, an appropriate light conversion material thickness for that group of LED chips can be determined based on the curve 505 and/or the above equation to provide an appearance of light having the desired color point.

Figure 7:
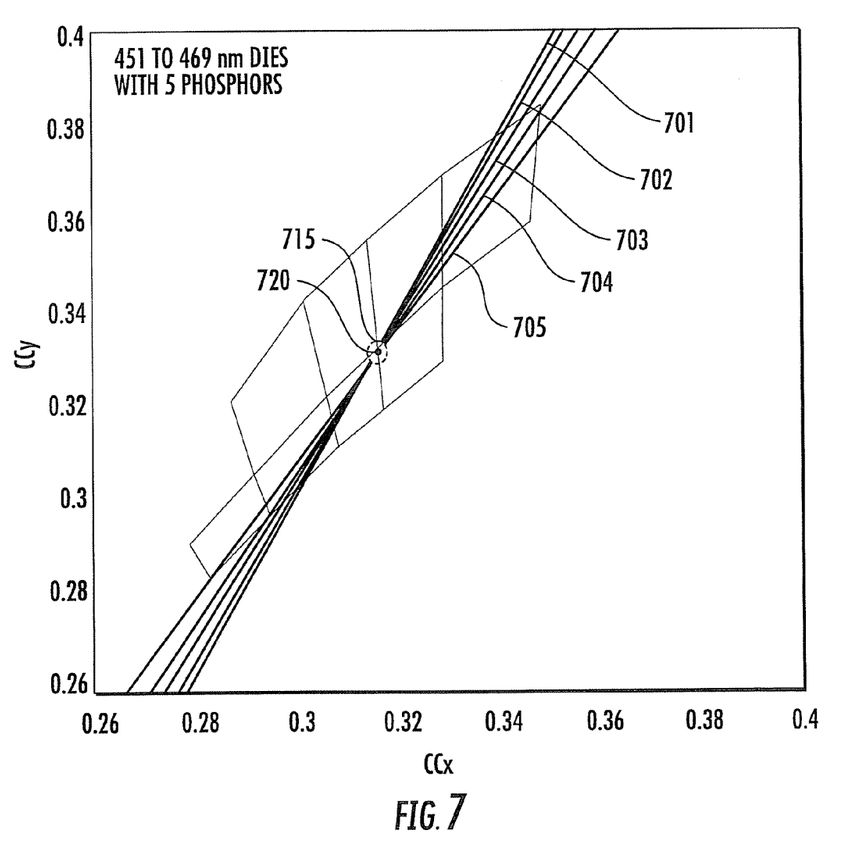
FIG. 7 is a region of a chromaticity diagram illustrating emission characteristics of packaged LEDs fabricated according to some embodiments of the present invention

FIGS. 6A-6E respectively illustrate packaged LEDs 600A-600E with tailored color points according to some embodiments of the present invention, while FIG. 7 is a region of a chromaticity diagram illustrating simulation results for the packaged LEDs of FIGS. 6A-6E. Referring now to FIGS. 6A-6E, the packaged LEDs 600A-600E respectively include a blue-emitting LED chips 601-605 having a different emission wavelengths. In particular, the LED chip 601 emits light having a peak wavelength of about 451 nm, the LED chip 602 emits light having a peak wavelength of about 455 nm, the LED chip 603 emits light having a peak wavelength of about 461 nm, the LED chip 604 emits light having a peak wavelength of about 465 nm, and the LED chip 605 emits light having a peak wavelength of about 469 nm. Each of the blue LED chips 601-605 is sorted into a different group based on their respective emission wavelengths, as discussed above, and is covered by a different type and/or amount of a yellow-emitting light conversion material. In particular, LED chips 601, 602, and 603 are covered by different thicknesses/amounts of a same light conversion material 621, such as YAG:Ce. LED chip 604 is covered by a different light conversion material 622, such as Ce:CaAlSiN$_3$, having a substantially similar thickness as the light conversion material 621 of the LED chip 601. The LED chip 605 is likewise covered by a different light conversion material 623, such as BOSE, having a substantially similar thickness as the light conversion material 621 of the LED chip 603. The color point and thickness of each light conversion material 621-623 was selected based on the emission characteristics of each of the blue LED chips 601-605 and a desired color point 720 illustrated in FIG. 7 such that a combination of the light emitted by each LED chip and the selected light conversion material provides an appearance of white light having the desired color point 720.

Referring now to FIG. 7, the lines 701, 702, 703, 704, and 705 respectively represent the color points that can be defined by a combination of the light output by the blue-emitting LED chips 601, 602, 603, 604, and 605 in combination with the light output by the yellow-emitting phosphors 621, 622, and 623 illustrated in FIGS. 6A-6E. As shown in FIG. 7, the lines 701-705 intersect within a 4-step Mac Adam ellipse 715 around the desired color point 720. Accordingly, the packaged LEDs 600A-600E according to some embodiments of the present invention may be configured to emit both blue and yellow light, which is perceived as white light at the same color point 720 despite the different emission characteristics of their individual component LED chips 601-605.

Although illustrated in FIGS. 6A-6E and FIG. 7 as including blue LED chips surrounded by a yellow-emitting light conversion material to provide white light, it is to be understood that packaged LEDs fabricated according to embodiments of the present invention may include other combinations of LED chips and light conversion materials selected based on any desired color point. As such, packaged LEDs may be fabricated in accordance with embodiments of the present invention to emit light having any desired color.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A method of fabricating a light emitting device (LED), the method comprising:
    measuring emission characteristics for a plurality of LED chips configured to emit light of a first color;
    sorting the plurality of LED chips based on the measured emission characteristics to provide a plurality of groups respectively including ones of the plurality of LED chips having similar measured emission characteristics;
    for each of the plurality of groups, selecting a respective light conversion material configured to absorb at least some of the light of the first color and responsively emit light of a second color based on the measured emission characteristics of the ones of the plurality of LED chips included therein and a desired color point;
    for each of the plurality of groups, responsive to selection of the respective light conversion material, determining a respective thickness of the respective light conversion material based on the measured emission characteristics of the ones of the plurality of LED chips included therein; and
    for each of the plurality of groups, depositing the respective light conversion material to the respective determined thickness on the ones of the LED chips included therein to provide a plurality of packaged LEDs comprising the plurality of LED chips and respectively configured to emit light having the desired color point.

2. The method of claim 1, wherein measuring the emission characteristics comprises measuring a radiant flux and/or a wavelength of the light emitted by each of the plurality of LED chips.

3. The method of claim 2, wherein selecting the respective light conversion material comprises:
    for each of the plurality of groups, selecting the respective light conversion material having a color point based on an average of the measured wavelengths for the ones of the LED chips included therein such that, when deposited thereon, the combination of the light emitted from the ones of the LED chips and the respective light conversion material provides the appearance of light having the desired color point.

4. The method of claim 3, wherein selecting the respective light conversion material further comprises:
    for each of the plurality of groups, determining color coordinates on a CIE 1931 chromaticity diagram based on a line defined by the average of the measured wavelengths for the ones of the LED chips included therein and the desired color point; and
    for each of the plurality of groups, selecting the respective light conversion material having the color point defined by determined color coordinates.

5. The method of claim 2, wherein determining a thickness of the respective light conversion material further comprises:
    for each of the plurality of groups, determining the respective thickness of the respective selected light conversion material based on an average of the measured radiant fluxes for the ones of the LED chips included therein such that the combination of the light emitted from the ones of the LED chips and the respective light conversion material provides the appearance of light having the desired color point.

6. The method of claim 5, wherein, for each of the plurality of groups, the respective light conversion material comprises a phosphor and an encapsulant solution, and wherein determining a thickness of the respective selected light conversion material comprises:
    for each of the plurality of groups, determining the thickness of the respective selected light conversion material based on a phosphor concentration per volume of the encapsulant solution.

7. The method of claim 5, wherein the respective light conversion material selected for each of the plurality of groups comprises a same light conversion material, and wherein the respective thickness determined for each of the plurality of groups comprises a different thickness.

8. The method of claim 3, wherein the respective light conversion material for each of the plurality of groups comprises a same light conversion material having different doping concentrations and/or particle sizes for each of the plurality of groups.

9. The method of claim 2, wherein, in each of the plurality of groups, the ones of the plurality of LED chips are respectively configured to emit light of the first color having a wavelength within a range of about 5 nanometer (nm) or less of one another.

10. The method of claim 2, wherein, in each of the plurality of groups, the ones of the plurality of LED chips are respectively configured to emit light of the first color having a radiant flux within a range of about 10 milliwatts (mW) to about 20 mW or less of one another.

11. The method of claim 1, wherein the light having the desired color point comprises light having a color point within a four-step MacAdam ellipse centered around the desired color point.

12. The method of claim 1, wherein the plurality of LED chips are configured to emit light within a blue wavelength range, and wherein the respective light conversion material selected for each of the plurality of groups comprises a yellow-emitting phosphor.

13. The method of claim 1, wherein, for each of the plurality of groups, the respective light conversion material comprises a first light conversion material, and further comprising:

for at least some of the plurality of groups, selecting a second light conversion material configured to absorb at least some of the light of the first and/or second colors and responsively emit light of a third color based on the measured emission characteristics of the ones of the plurality of LED chips included therein, the emission characteristics of the first light conversion material, and the desired color point; and for the at least some of the plurality of groups, depositing the respective second light conversion material on the ones of the LED chips included therein to provide the plurality of packaged LEDs comprising the plurality of LED chips and respectively configured to emit light having the desired color point.

14. The method of claim 13, wherein the plurality of LED chips are configured to emit light within a blue wavelength range, wherein the first light conversion material selected for each of the plurality of groups comprises a yellow-emitting phosphor, and wherein the second light conversion material selected for the at least some of the plurality of groups comprises a red-emitting phosphor.

15. A method of fabricating a light emitting device (LED), the method comprising:

measuring emission characteristics for a plurality of LED chips;

sorting the plurality of LED chips based on the measured emission characteristics to provide first and second groups respectively including ones of the plurality of LED chips having similar measured emission characteristics;

for the first group, selecting a first light conversion material based on the measured emission characteristics of the ones of the plurality of LED chips included therein and a desired color point, wherein the first light conversion material is configured to absorb light of at least one wavelength emitted by the ones of the plurality of LED chips of the first group and responsively emit light of a different wavelength;

determining a first thickness of the first light conversion material based on the measured emission characteristics of the ones of the LED chips of the first group and responsive to selection of the first light conversion material;

for the second group, selecting a second light conversion material based on the measured emission characteristics of the ones of the plurality of LED chips included therein and the desired color point, wherein the second light conversion material is configured to absorb light of at least one wavelength emitted by the ones of the plurality of LED chips of the second group and responsively emit light of a different wavelength;

determining a second thickness of the second light conversion material based on the measured emission characteristics of the ones of the LED chips of the second group and responsive to selection of the second light conversion material;

depositing the first light conversion material to the first thickness on the ones of the LED chips included in the first group to provide a first plurality of packaged LEDs configured to emit light at the desired color point; and depositing the second light conversion material to the second thickness on the ones of the LED chips included in the second group to provide a second plurality of packaged LEDs configured to emit light at the desired color point.

16. The method of claim 15, wherein measuring the emission characteristics comprises measuring a peak wavelength of the light emitted by each of the plurality of LED chips, and wherein selecting the first and second light conversion materials comprises:

selecting the first light conversion material having a color point based on an average of the measured wavelengths for the ones of the LED chips of the first group such that, when deposited thereon, the combination of the light emitted from the ones of the LED chips of the first group and the first light conversion material provides the appearance of light having the desired color point; and selecting the second light conversion material having a color point based on an average of the measured wavelengths for the ones of the LED chips of the second group such that, when deposited thereon, the combination of the light emitted from the ones of the LED chips of the second group and the respective light conversion material provides the appearance of light having the desired color point.

17. The method of claim 15, wherein measuring the emission characteristics comprises measuring a radiant flux of the light emitted by each of the plurality of LED chips, and wherein determining the first and second thicknesses of the first and second light conversion materials comprises:

determining the first thickness of the first light conversion material based on an average of the measured radiant fluxes for the ones of the LED chips of the first group such that the combination of the light emitted from the ones of the LED chips of the first group and the first light conversion material provides the appearance of light having the desired color point; and determining the second thickness of the second light conversion material based on an average of the measured radiant fluxes for the ones of the LED chips of the second group such that the combination of the light emitted from the ones of the LED chips of the second group and the second light conversion material provides the appearance of light having the desired color point.

18. An apparatus for fabricating a light emitting device (LED), comprising:

a sensor configured to measure emission characteristics for a plurality of LED chips configured to emit light of a first color;

a sorting mechanism configured to sort the plurality of LED chips based on the measured emission characteristics to provide a plurality of groups respectively including ones of the plurality of LED chips having similar measured emission characteristics;

a reservoir containing a plurality of light conversion materials configured to absorb at least some of the light of the first color and responsively emit light of a second color;

a light conversion material supply line coupled to the reservoir;

a controller configured to select a respective one of the plurality of light conversion materials for each of the plurality of groups based on the measured emission characteristics of the ones of the plurality of LED chips included therein and a desired color point, determine a respective thickness of the respective light conversion material selected for each of the plurality of groups based on the measured emission characteristics of the ones of the LED chips included therein and responsive to selection of the respective light conversion material, and provide a signal to the reservoir to supply an amount of the respective light conversion material selected for each of the plurality of groups corresponding to the respective thickness determined for each of the plurality of groups to the supply line;

a dispensing mechanism coupled to the supply line and configured to deposit the respective light conversion material selected for each of the plurality of groups to the respective thickness determined for each of the plurality of groups on the ones of the LED chips included therein to provide a plurality of packaged LEDs comprising the plurality of LED chips, wherein the plurality of packaged LEDs are respectively configured to emit light having the desired color point.

19. The apparatus of claim 18, wherein the sensor is configured to measure a radiant flux and/or a wavelength of the light emitted by each of the plurality of LED chips.

20. The apparatus of claim 19, wherein the controller is configured to select the respective light conversion material for each of the plurality of groups having a color point based on an average of the measured wavelengths for the ones of the LED chips included therein such that, when deposited thereon, the combination of the light emitted from the ones of the LED chips and the respective light conversion material provides the appearance of light having the desired color point.

21. The apparatus of claim 19, wherein the controller is configured to determine the respective thickness of the respective selected light conversion material for each of the plurality of groups based on an average of the measured radiant fluxes for the ones of the LED chips included therein such that the combination of the light emitted from the ones of the LED chips included therein and the respective light conversion material provides the appearance of light having the desired color point.

* * * * *